(12) United States Patent
Inukai et al.

(10) Patent No.: US 7,338,897 B2
(45) Date of Patent: Mar. 4, 2008

(54) METHOD OF FABRICATING A SEMICONDUCTOR DEVICE HAVING METAL WIRING

(75) Inventors: Kazuaki Inukai, Shizwoka (JP); Atsushi Matsushita, Nagasaki (JP)

(73) Assignee: Rohm Co., Ltd., Kyoto-Shi, Kyoto (JP)

( * ) Notice: Subject to any disclaimer, the term of this patent is extended or adjusted under 35 U.S.C. 154(b) by 275 days.

(21) Appl. No.: 11/014,884

(22) Filed: Dec. 20, 2004

(65) Prior Publication Data

US 2005/0136644 A1   Jun. 23, 2005

(30) Foreign Application Priority Data

Dec. 22, 2003   (JP) .............................. 2003-424568

(51) Int. Cl.
*H01L 21/4763* (2006.01)

(52) U.S. Cl. ................ 438/640; 438/736; 257/E21.578

(58) Field of Classification Search ................ 438/618, 438/622, 624, 626, 631, 634, 637, 639, 645, 438/675, 687, 736; 257/E21.575, E21.577, 257/E21.578, E21.579
See application file for complete search history.

(56) References Cited

U.S. PATENT DOCUMENTS

| | | | | |
|---|---|---|---|---|
| 6,503,840 B2 * | 1/2003 | Catabay et al. | ............. | 438/694 |
| 6,509,279 B2 * | 1/2003 | Fujii et al. | ................... | 438/778 |
| 6,607,986 B2 | 8/2003 | Seta et al. | | |
| 6,630,406 B2 * | 10/2003 | Waldfried et al. | .......... | 438/710 |
| 6,723,631 B2 | 4/2004 | Noguchi et al. | | |
| 6,737,744 B2 * | 5/2004 | Fukuyama | ................. | 257/750 |

FOREIGN PATENT DOCUMENTS

| | | |
|---|---|---|
| JP | 8-293490 | 11/1996 |
| JP | 2002-9050 | 1/2002 |
| JP | 2003-332340 | 11/2003 |
| JP | 2004-103747 | 4/2004 |
| JP | 2004-140151 | 5/2004 |

OTHER PUBLICATIONS

Kojima et al., "Mechanism of Cu Oxidation in Ashing Process", 2001 Dry Process International Symposium V-1, pp. 165-168.

* cited by examiner

*Primary Examiner*—Brook Kebede
(74) *Attorney, Agent, or Firm*—Leydig, Voit & Mayer, Ltd.

(57) ABSTRACT

A method of fabricating a semiconductor device includes forming a metal wire on a substrate, forming an interlayer insulating film on the metal wire, forming a resist pattern on the interlayer insulating film, selectively etching the interlayer film to form a trench or via-hole in the interlayer insulating film and reaching the metal wire, and ashing, using a reducing gas, to remove the resist pattern.

9 Claims, 6 Drawing Sheets

METHOD OF FABRICATING A SEMICONDUCTOR DEVICE HAVING METAL WIRING

BACKGROUND OF THE INVENTION

1. Field of the Invention

The present invention relates to a method of fabricating a semiconductor device and, in particular, relates to a method of fabricating a semiconductor device having metal wiring.

2. Description of Related Art

Metal wiring in a semiconductor integrated circuit may cause a serious problem of signal delay due to an increase in wiring resistance and an increase in parasitic capacitance between wires following a reduction in wiring pitch. In order to solve this problem, such a technique that uses copper as a wiring material and a low dielectric constant film (low-k film) as an interlayer insulating film has been essential. As this technique, use has been mainly made of the so-called Damascine process wherein trenches and/or contact holes are formed in a low dielectric constant film, a copper film is embedded therein, then planarization is carried out by chemical mechanical polishing (hereinafter referred to as "CMP"). A porous low dielectric constant film with small holes introduced in the film is known as a typical low dielectric constant film.

In a conventional technique, a low dielectric constant film formed on metal wiring of copper or the like is etched by the use of a resist pattern as a mask to thereby expose the surface of the metal wiring. However, there has been a problem that when ashing is carried out using an oxidizing gas such as $O_2$ plasma in an ashing process for removing the resist pattern, a metal oxide film is formed on the exposed metal wiring to cause failure in electrical continuity (e.g. see JP-A-H08-293490).

FIGS. 12 to 15 are sectional views of a semiconductor device for describing a process of etching a low dielectric constant film to thereby form a contact hole on a metal wire by the use of a forming method according to the foregoing conventional technique.

Figure 12:
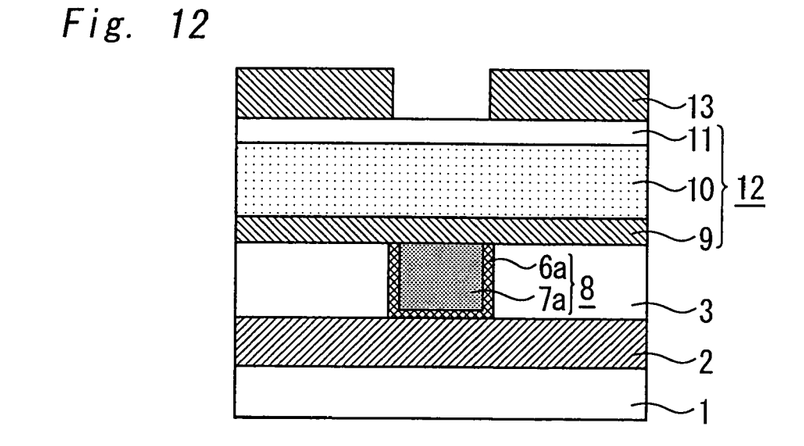
FIGS. 12 to 15 are sectional views of a semiconductor device for describing a process of etching a low dielectric constant film by a conventional technique.

First, as shown in FIG. 12, a first insulating film 2 and a second insulating film 3 are formed on a semiconductor substrate 1, and a first embedded wire 8 composed of a first barrier metal 6a and a first embedded copper film 7a is formed in the second insulating film 3.

Further, a third insulating film 9, a fourth insulating film 10, and a fifth insulating film 11 are stacked in layers on the second insulating film 3 and the first embedded wire 8, and a resist pattern 13 is formed on the fifth insulating film 11.

Figure 13:
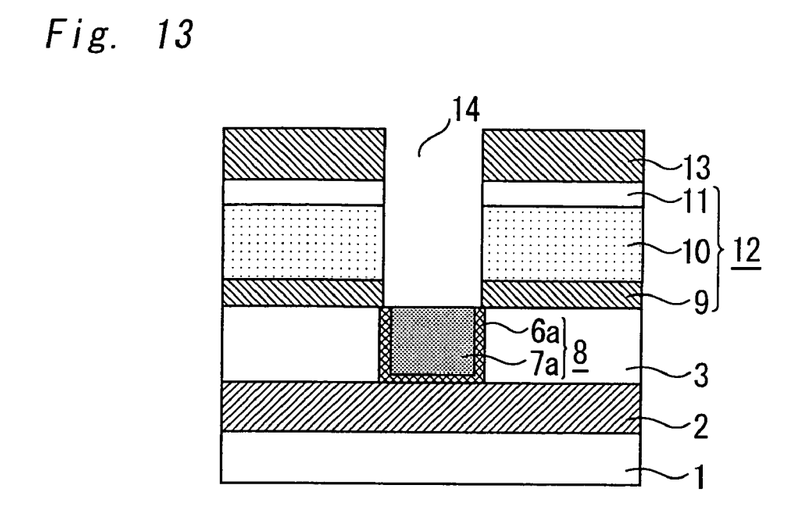

Then, as shown in FIG. 13, using the resist pattern 13 as a mask, the fifth insulating film 11, the fourth insulating film 10, and the third insulating film 9 are etched to form a contact hole 14 to thereby expose the surface of the first embedded wire 8.

Figure 14:
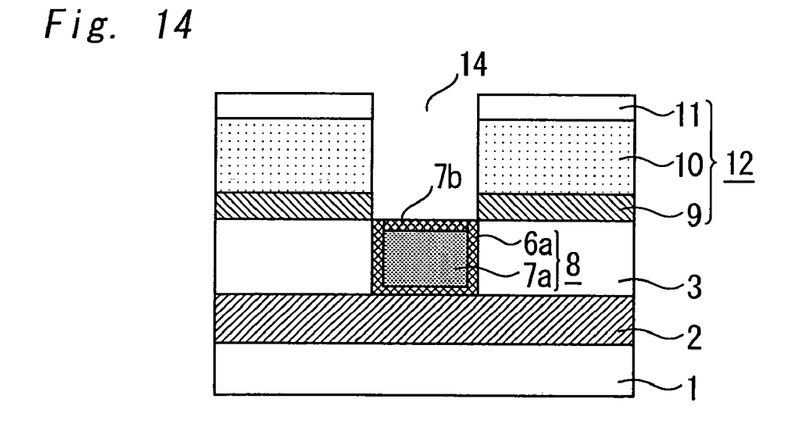

Then, as shown in FIG. 14, the resist pattern 13 (see FIG. 13) is removed by ashing using an oxidizing gas. In this event, a copper oxide (CuO) 7b in the form of a metal oxide film is formed on the surface of the first embedded wire 8 due to the influence of the oxidizing gas.

The copper oxide 7b serves as an insulating film. Thus, if wiring or a plug is formed in the contact hole 14 with the copper oxide 7b remaining, it may cause an increase in resistance of the contact hole or occurrence of wiring failure (e.g. see JP-A-H08-293490).

Figure 15:
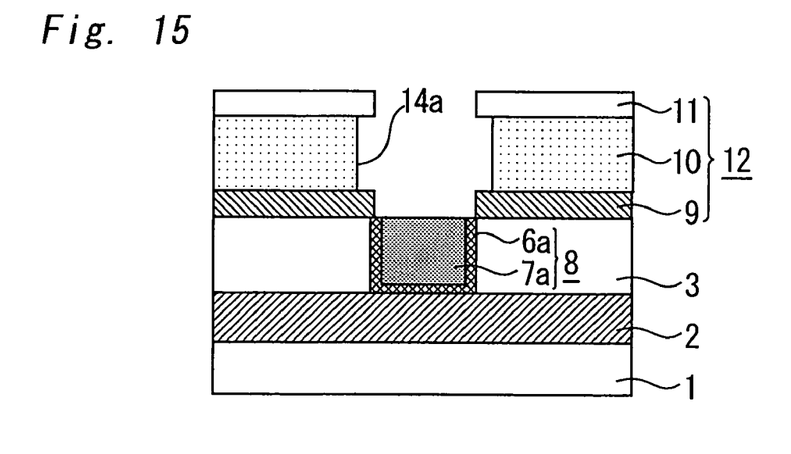

If cleaning is carried out to remove the copper oxide 7b shown in FIG. 14 for preventing the phenomena, the fourth insulating film 10 is subjected to occurrence of an undercut 14a as shown in FIG. 15, which may cause failure in embedding a metal film to this portion in a later process.

Figure 16:
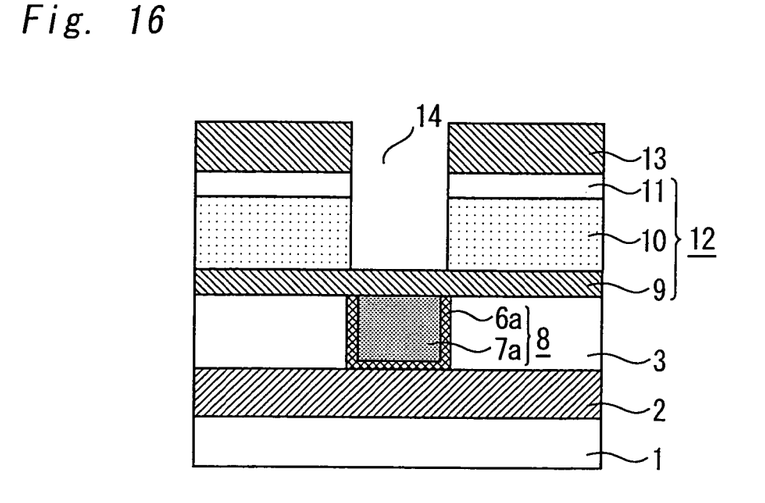
FIGS. 16 to 18 are sectional views of a semiconductor device for describing a fabrication method according to another conventional technique.
Figure 17:
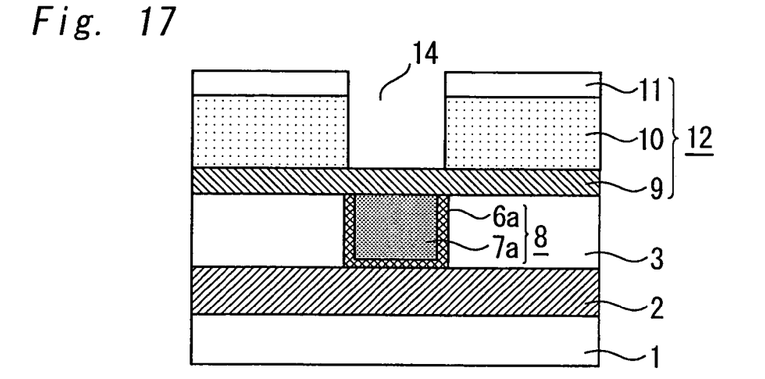
Figure 18:
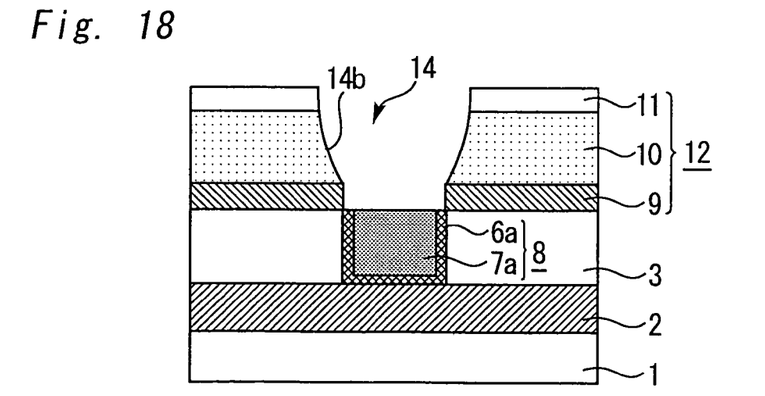

FIGS. 16 to 18 are sectional views of a semiconductor device for describing a fabrication method according to another conventional technique which is adapted to prevent the formation of the copper oxide 7b (see FIG. 14) on the first embedded wire 8 and the formation of the undercut 14a (see FIG. 15).

As shown in FIG. 16, using the resist pattern 13 as a mask, the fifth insulating film 11 and the fourth insulating film 10 are etched to thereby expose the surface of the third insulating film 9.

Then, as shown in FIG. 17, the resist pattern 13 (see FIG. 16) is removed by ashing with an oxidizing gas. Further, as shown in FIG. 18, using the fifth insulating film 11 and the fourth insulating film 10 as a mask, the third insulating film 9 is etched to thereby expose the surface of the first embedded wire 8.

In this event, since the process, shown in FIG. 17, of removing the resist pattern 13 (see FIG. 16) is performed prior to the process, shown in FIG. 18, of exposing the surface of the first embedded wire 8, no copper oxide (CuO) is formed on the surface of the first embedded wire 8 in FIG. 18.

However, as shown in FIG. 18, since the third insulating film 9 is etched by the use of the fifth insulating film 11 and the fourth insulating film 10 as the mask, facets (inclined surfaces) 14b are formed on side surfaces of the fifth insulating film 11 and the fourth insulating film 10. If such facets 14b are formed, the whole width of the contact hole 14 increases to thereby cause a hindrance to fine processing of the contact hole.

As described above, when forming the contact hole on the metal wire of copper or the like, either of the foregoing methods, i.e. the conventional ashing with the oxidizing gas, cannot achieve both the prevention of formation of the metal oxide film on the metal wire and the fine processing of the contact hole.

As described above, there has been a problem that, in the semiconductor device fabrication method which forms the contact hole on the metal wire, either of the foregoing conventional techniques cannot achieve both the prevention of formation of the metal oxide film on the metal wire and the fine processing of the contact hole.

The present invention has been made for solving the foregoing problem and has an object to provide an excellent semiconductor device fabrication method adapted to form a trench or a contact hole on a metal wire, which can achieve both prevention of formation of a metal oxide film on the metal wire and fine processing capable of obtaining an excellent shape of the contact hole.

SUMMARY OF THE INVENTION

According to one aspect of the present invention, in a semiconductor device fabrication method, a metal wire is formed on a substrate, and an interlayer insulating film is formed on the metal wire. Then, a resist pattern is formed on the interlayer insulating film, and the interlayer insulating film is selectively etched via the resist pattern to form therein a trench or a contact hole reaching an upper surface of the metal wire. Then, ashing is performed for removing the resist pattern by using a reducing gas.

In another aspect, the reducing gas is preferably one of a mixture gas of $H_2$ and an inert gas, an $NH_3$ gas, a mixture gas of $NH_3$ and $H_2$, a mixture gas of $NH_3$ and $N_2$, and a mixture gas of $H_2$ and $N_2$.

According to the present invention, it is possible to obtain an excellent semiconductor device fabrication method adapted to form a trench or a contact hole on a metal wire, which can achieve both prevention of formation of a metal oxide film on the metal wire and fine processing capable of obtaining an excellent shape of the contact hole.

Other and further objects, features and advantages of the invention will appear more fully from the following description.

DETAILED DESCRIPTION OF THE PREFERRED EMBODIMENTS

FIGS. 1 to 11 are process descriptive diagrams for describing a semiconductor device fabrication method according to an embodiment of the present invention in due order by the use of sectional views of a semiconductor device.

Figure 1:
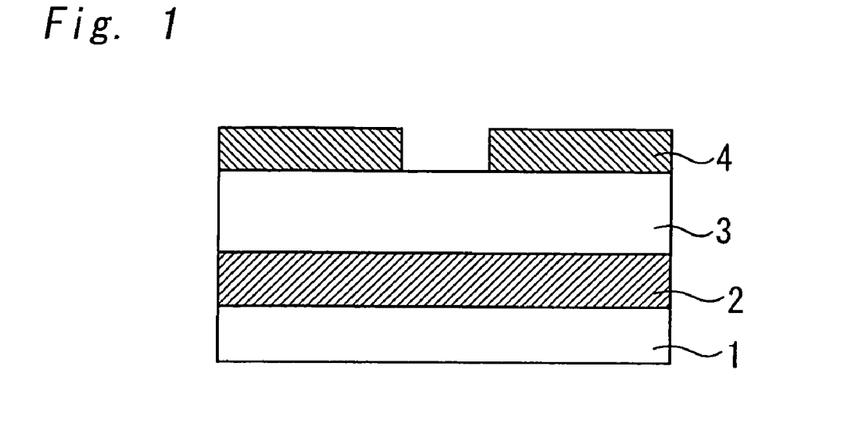
FIGS. 1 to 11 are process descriptive diagrams for describing a semiconductor device fabrication method according to an embodiment of the present invention.

First, as shown in FIG. 1, a first insulating film 2 in the form of a silicon oxide film is formed to a thickness of about 300 nm on a main surface of a semiconductor substrate 1 by chemical vapor deposition (hereinafter referred to as "CVD") under normal pressure. Then, a second insulating film 3 is formed to a thickness of about 500 to 600 nm on the first insulating film 2 by plasma CVD. Further, a resist pattern 4 is formed on the second insulating film 3 by lithography.

Figure 2:
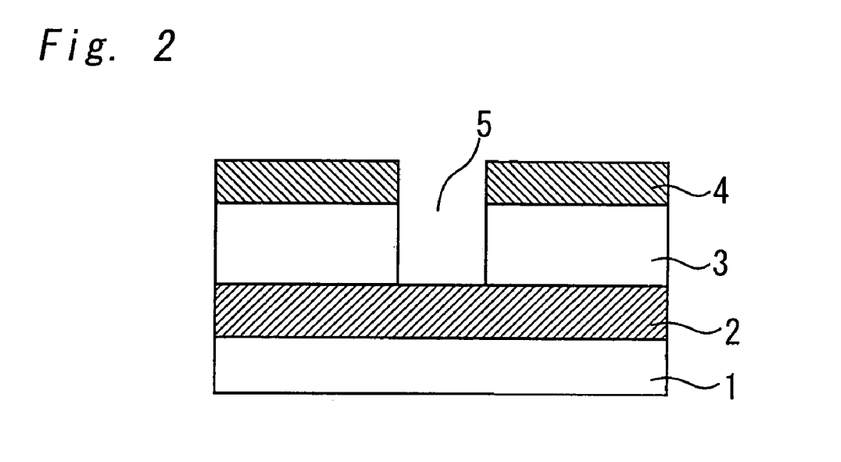

Then, as shown in FIG. 2, using the resist pattern 4 as a mask, the second insulating film 3 is etched to thereby form a wiring trench 5. In this event, the surface of the first insulating film 2 is exposed at the bottom of the wiring trench 5. Thereafter, although not illustrated, the resist pattern 4 is removed.

Figure 3:
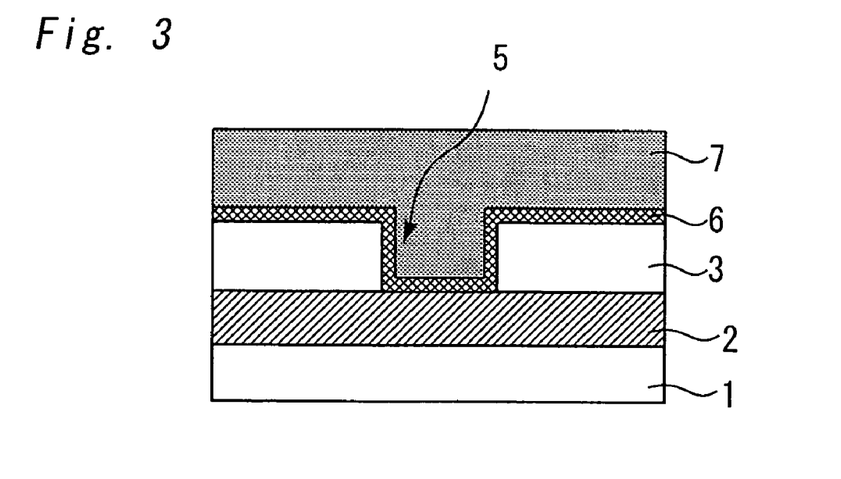

Then, as shown in FIG. 3, a barrier metal film 6 made of TiN or the like is formed to a thickness of about 30 nm on inner surfaces of the wiring trench 5 and on the second insulating film 3 by CVD. In this event, the barrier metal film 6 forms a trench. Further, a copper film 7 is formed to a thickness of about 500 nm by sputtering so as to fill up the trench formed by the barrier metal film 6.

Figure 4:
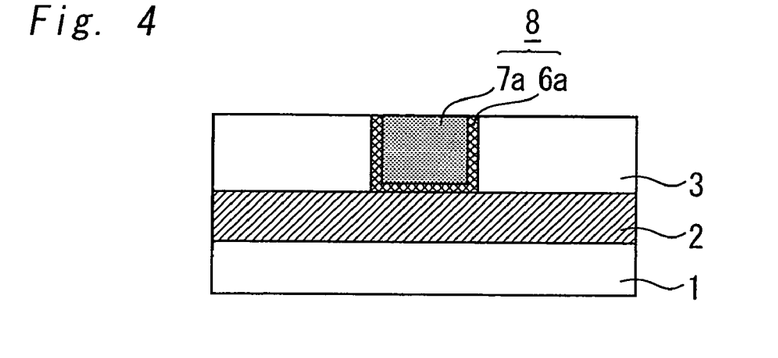

Then, as shown in FIG. 4, the barrier metal film 6 and the copper film 7 (see FIG. 3) formed outside the wiring trench 5 (see FIG. 3) are removed by CMP to thereby form a first barrier metal 6a and a first embedded copper film 7a. For the sake of description, the first barrier metal 6a and the first embedded copper film 7a will be collectively referred to as a first embedded wire 8.

Figure 5:
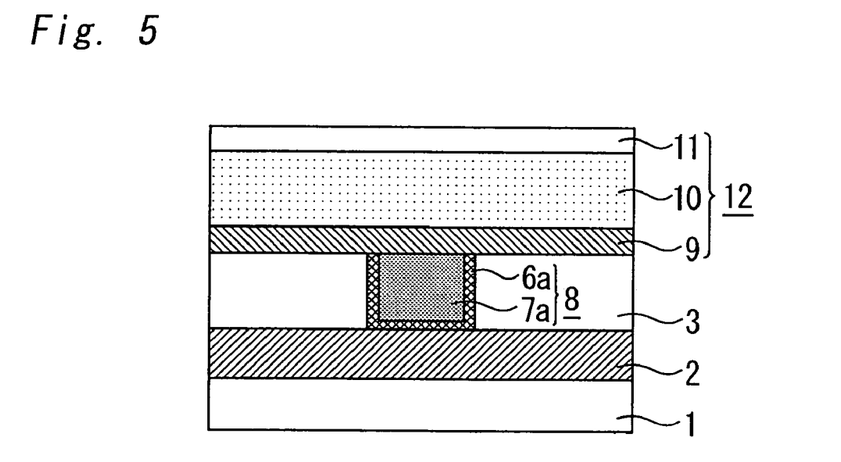

Then, as shown in FIG. 5, a third insulating film 9 made of SiC is formed to a thickness of about 50 nm by plasma CVD method on the first embedded wire 8 and the second insulating film 3, i.e. on the whole surface. Then, a fourth insulating film 10 in the form of a SiOC is formed to a thickness of about 300 to 500 nm on the third insulating film 9 by plasma CVD method. Further, a fifth insulating film 11 in the form of a silicon oxide film is formed to a thickness of about 50 nm on the fourth insulating film 10 by plasma CVD. For the sake of description, the third insulating film 9, the fourth insulating film 10, and the fifth insulating film 11 will be collectively referred to as an interlayer insulating film 12.

Here, the third insulating film 9 is a film to be used as an etching stopper film when forming a contact hole on the first embedded wire 8 in a later process.

As the fourth insulating film 10, use is made of a low dielectric constant film, having a relative dielectric constant lower than that of the silicon oxide film generally and widely used, for the purpose of reduction in parasitic capacitance between wires. The relative dielectric constant of the low dielectric constant film used herein is about 2.8-3.5 that is fully lower as compared with a silicon oxide film having relative dielectric constant of about 3.9.

Further, the fifth insulating film 11 is a film for preventing peeling or cracking of the third insulating film 9 and the fourth insulating film 10 when carrying out CMP in a process of embedded wiring formation within the contact hole which will be formed later.

In general, a lower relative dielectric constant is more desirable in terms of reducing the parasitic capacitance between wires. However, if it is too low, a mechanical strength as an insulating film is weakened so that peeling or cracking is liable to occur. In view of this, it is preferable to use a low dielectric constant film having a relative dielectric constant of 2.8-3.5 in terms of balancing between the lowness of the relative dielectric constant and the mechanical strength as the insulating film.

Figure 6:
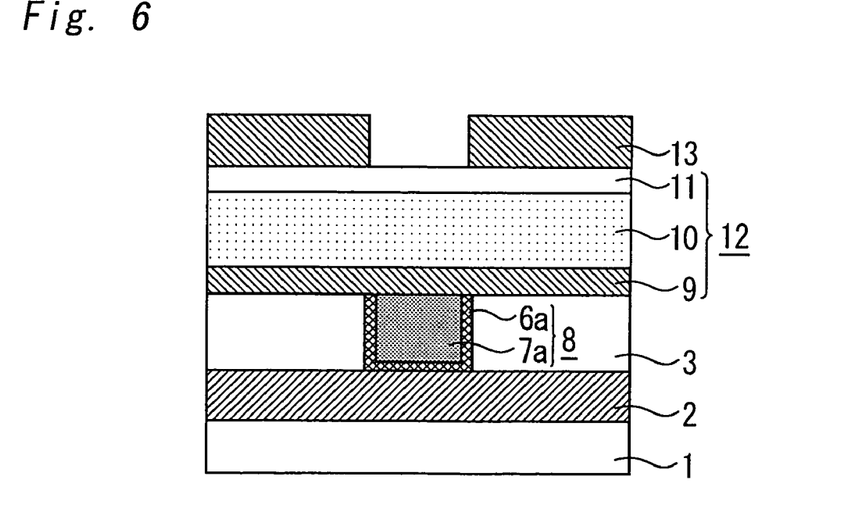

Then, as shown in FIG. 6, a resist pattern 13 is formed on the fifth insulating film 11 by lithography.

Figure 7:
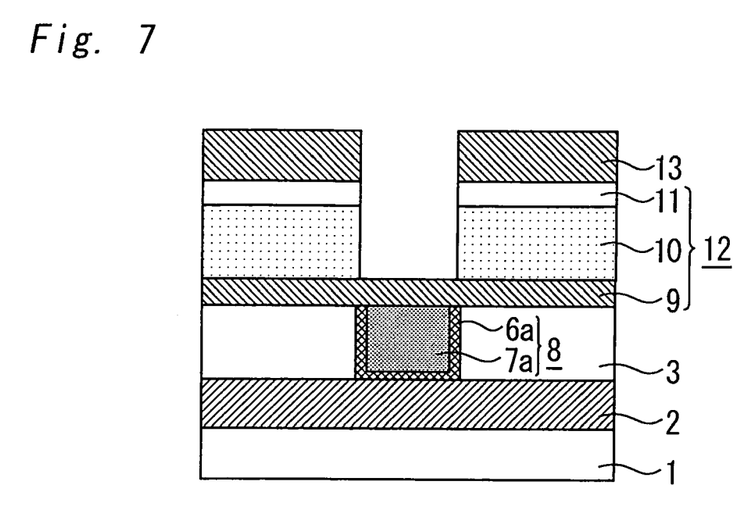

Then, as shown in FIG. 7, using the resist pattern 13 as a mask, the fifth insulating film 11 and the fourth insulating film 10 are etched to thereby expose the third insulating film 9 serving as the etching stopper film.

An etching apparatus used herein is a parallel flat plate type reactive ion etching apparatus of a dual frequency excitation that, for example, comprises a stage for placing a wafer thereon, a lower electrode, and an upper electrode confronting the lower electrode within a chamber and applies a high frequency of 60 MHz to a high frequency power supply connected to the upper electrode and a high frequency of 2 MHz to a high frequency power supply connected to the lower electrode.

Here, description will be given about the etching condition for the fifth insulating film 11 and the fourth insulating film 10. Etching is carried out with a CF etchant by introducing a gas of $C_4F_8/N_2/Ar=15/225/1400$ sccm into the etching chamber as an etching gas, holding the pressure in the etching chamber to 10 Pa, and applying 2400 W to the upper electrode and 3300 W to the lower electrode to generate plasma. In this event, the etching is performed while keeping the temperature of the stage with the wafer placed thereon at 40° C.

Figure 8:
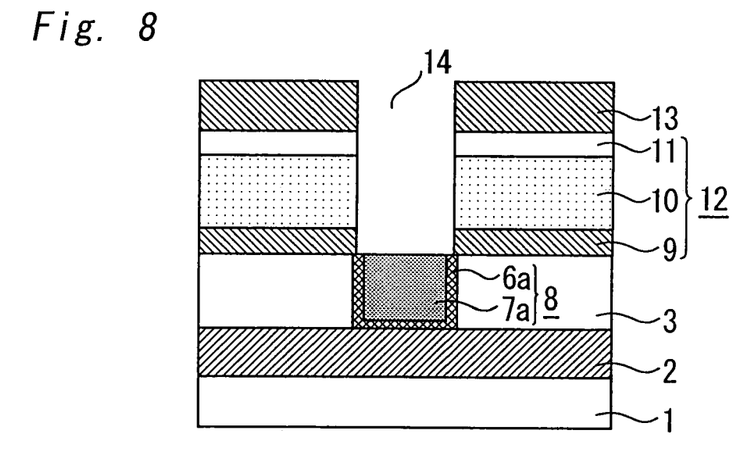

Then, as shown in FIG. 8, following the etching of the fifth insulating film 11 and the fourth insulating film 10, the third insulating film 9 is etched by using the resist pattern 13 as a mask to expose an upper surface of the first embedded wire 8 to thereby form a contact hole 14.

The etching apparatus used herein is the same apparatus as that used for etching the fifth insulating film 11 and the fourth insulating film 10.

Here, description will be given about the etching condition for the third insulating film 9. Etching is carried out by introducing a gas of $CF_4/N_2=50/300$ sccm into the etching chamber as an etching gas, holding the pressure in the etching chamber to 20 Pa, and applying 1000 W to the upper electrode and 200 W to the lower electrode to generate plasma. Also in this event, the etching is performed while keeping the temperature of the stage with the wafer placed thereon at 40° C.

Here, since the third insulating film 9 is etched by using the resist pattern 13 as the mask, the fifth insulating film 11 and the fourth insulating film 10 are not subjected to formation of the facets 14b (see FIG. 18) so that the contact hole 14 is formed perpendicular to the main surface of the semiconductor substrate 1 and thus has an excellent shape.

Figure 9:
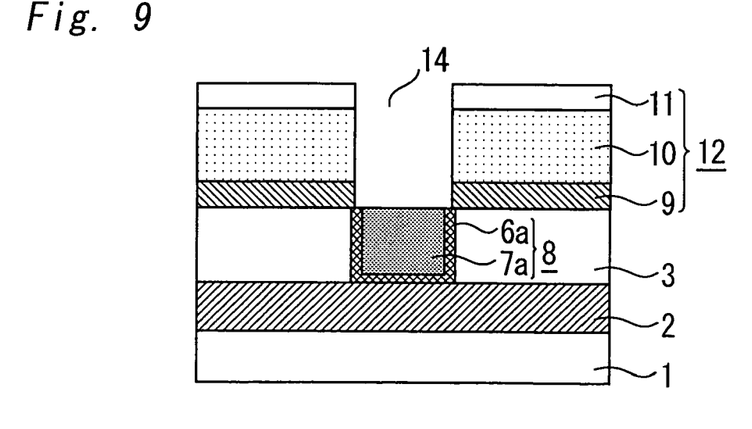

Then, as shown in FIG. 9, the resist pattern 13 (see FIG. 8) is removed by ashing.

The ashing process in this event will be described. The ashing process is carried out by holding the temperature in a first chamber, where the ashing process is performed, to about 200 to 400° C. and the pressure therein to about 130 to 135 Pa, generating plasma in a second chamber separate from the first chamber by using a mixture gas of $H_2$ (hydrogen) and He (helium), and transporting a gas containing radicals thereof into the first chamber by the use of a carrier gas. Thus, removal of resist by hydrogen radical is made possible.

Here, as the gas used for ashing the resist pattern 13, use is made of the mixture gas of $H_2$ (hydrogen) and inert gas. For example, a mixture gas of $H_2$ and He (helium) is used that has the volume ratio of $H_2$ (hydrogen) to the whole mixture gas in the range of 1% to 10%. It is confirmed that ashing rate would not decrease even the volume ratio is 1-5%.

Since this mixture gas is a reducing gas, the copper oxide 7b (see FIG. 14) is not formed on the surface of the first embedded wire 8 after the ashing. This is owing to the ashing method as described above.

A reducing gas that can be used for ashing the resist pattern 13 is a mixture gas of $H_2$ (hydrogen) and an inert gas, an $NH_3$ (ammonia) gas, a mixture gas of $NH_3$ (ammonia) and $H_2$ (hydrogen), a mixture gas of $NH_3$ (ammonia) and $N_2$ (nitrogen), or a mixture gas of $H_2$ (hydrogen) and $N_2$ (nitrogen).

As described above, carrying out the ashing using the reducing gas prevents the formation of the copper oxide 7b (see FIG. 14) on the surface of the first embedded wire 8 to thereby enable excellent wiring formation.

Further, an inert gas that can be used in the mixture gas with $H_2$ (hydrogen) is He (helium), Ne (neon), Ar (argon), Kr (krypton), or Xe (xenon). By mixing one of these gases with $H_2$ (hydrogen), it is possible to stabilize the ashing rate.

When Ar (argon) gas is used as the inert gas, the volume ratio of $H_2$ (hydrogen) to the whole mixture gas is made somewhat larger. In the mixture gas of $H_2$ (hydrogen) and Ar (argon), the volume ratio of $H_2$ (hydrogen) to the whole mixture gas is made 10% or more. When the volume ratio of $H_2$ (hydrogen) is decreased, ashing rate is lowered. However, when the volume ratio of $H_2$ (hydrogen) is 10% or more, decrease of thorough put is suppressed.

Figure 10:
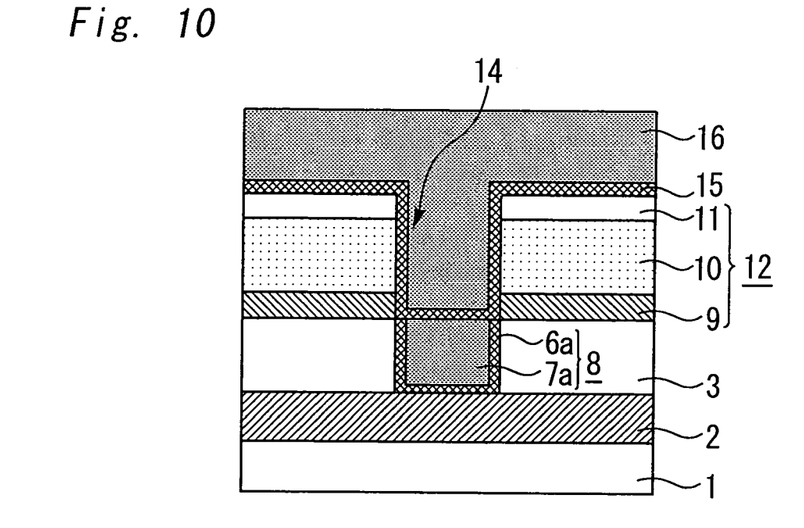

Thereafter, as shown in FIG. 10, a barrier metal film 15 made of TiN is formed to a thickness of 30 nm by CVD on inner surfaces of the contact hole 14 and on the fifth insulating film 11, and a copper film 16 is further formed so as to fill up a trench formed by the barrier metal film 15.

Figure 11:
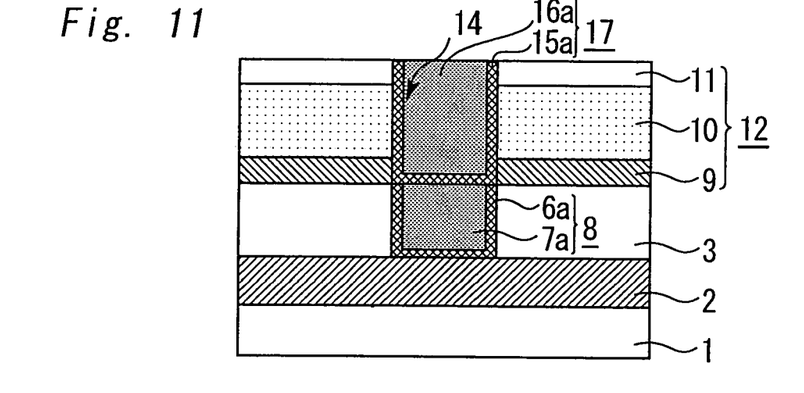

Further, as shown in FIG. 11, the barrier metal film 15 and the copper film 16 (see FIG. 10) formed outside the contact hole 14 are removed by CMP to thereby form a second barrier metal 15a and a second embedded copper film 16a. For the sake of description, the second barrier metal 15a and the second embedded copper film 16a will be collectively referred to as a second embedded wire 17.

In this embodiment described above, the first embedded wire 8 including the copper film is formed as the metal wire (see FIG. 4). However, a similar effect is achieved even by using a metal wire made of aluminum or the like instead of copper. Further, the wiring structure may not necessarily be the embedded wiring structure.

In this embodiment described above, the interlayer insulating film 12 is formed as an interlayer insulating film by stacking in layers the three films, i.e. the third insulating film 9, the fourth insulating film 10, and the fifth insulating film 11, on the first embedded wire 8, wherein the fourth insulating film 10 is the low dielectric constant film (see FIG. 5). However, the interlayer insulating film is not necessarily in the form of films stacked in layers. It may be a low dielectric constant film of a single layer or films stacked in layers and including at least one low dielectric constant film.

Alternatively, when the reduction in parasitic capacitance between wires is not required, for example, when the interval between wires is large, the interlayer insulating film does not necessarily include the low dielectric constant film. For example, it may be a silicon oxide film of a single layer or films stacked in layers and including a stopper film such as a silicon nitride film and a silicon oxide film.

In this embodiment described above, the contact hole reaching the upper surface of the first embedded wire 8 is formed in the interlayer insulating film 12 (see FIG. 8). The contact hole described herein is a hole having, for example, a square shape with each side of 0.2 μm or a circular shape with a diameter of 0.2 μm as seen from the main surface of the semiconductor substrate, formed in the interlayer insulating film, and having a bottom reaching the upper surface of the metal wire.

Instead of the above shape, a similar effect is also achieved by providing a trench having, for example, a rectangular shape with a short side of 0.2 μm and a long side of 5 μm as seen from the main surface of the semiconductor substrate, formed in the interlayer insulating film, and having a bottom reaching the upper surface of the metal wire.

As described above, in the fabrication method according to the embodiment of the present invention, the metal wire is formed on the semiconductor substrate, the interlayer insulating film is formed on the metal wire, and the resist pattern is formed on the interlayer insulating film. Then, the interlayer insulating film is etched by using the resist pattern as the mask to thereby form therein a contact hole reaching the upper surface of the metal wire, then the ashing process is carried out to remove the resist pattern. In the ashing process, the reducing gas is used.

In the ashing process, use is made of the reducing gas selected from the mixture gas of $H_2$ (hydrogen) and the inert gas, the $NH_3$ (ammonia) gas, the mixture gas of $NH_3$ (ammonia) and $H_2$ (hydrogen), the mixture gas of $NH_3$ (ammonia) and $N_2$ (nitrogen), and the mixture gas of $H_2$ (hydrogen) and $N_2$ (nitrogen).

Further, the inert gas that can be used in the mixture gas with $H_2$ (hydrogen) is He (helium), Ne (neon), Ar (argon), Kr (krypton), or Xe (xenon).

As described above, since the reducing gas is used in the ashing process to remove the resist pattern 13 (see FIG. 8), no metal oxide film is formed on the exposed surface of the first embedded wire 8 (see FIG. 9).

Further, the ashing rate can be stabilized by using the mixture gas of $H_2$ (hydrogen) and the inert gas (He, Ne, Ar, Kr, or Xe) as the reducing gas.

Further, it is possible to form on the metal wire the contact hole of the excellent shape that is not subjected to the formation of facets and is perpendicular to the main surface of the semiconductor substrate (see FIG. 9).

Therefore, it is possible to obtain the semiconductor device fabrication method adapted to form the trench or the contact hole on the metal wire, which can achieve both the prevention of formation of the metal oxide film on the metal wire and the fine processing capable of obtaining the excellent shape of the contact hole and thus realize the excellent fine processing.

It is further understood that the foregoing description is a preferred embodiment of the disclosed method and that various changes and modifications may be made in the invention without departing from the spirit and scope thereof.

What is claimed is:

1. A semiconductor device fabrication method comprising:
   forming a metal wire on a substrate;
   forming an interlayer insulating film on said metal wire;
   forming a resist pattern on said interlayer insulating film;
   selectively etching said interlayer insulating film via said resist pattern to form a trench or a contact hole in said interlayer insulating film reaching an upper surface of said metal wire; and
   ashing, using a reducing gas, to remove said resist pattern wherein said reducing gas is selected from the group consisting of a mixture of $H_2$ and an inert gas, a mixture of $NH_3$ and $H_2$, and a mixture of $H_2$ and $N_2$, wherein a volume ratio of $H_2$ to the mixture is 1% to 10%.

2. The semiconductor device fabrication method according to claim 1 further comprising:
   forming a metal layer on said interlayer insulating film and embedded in said trench or contact hole, following ashing, and;
   removing said metal layer outside of said trench or contact hole by chemical mechanical polishing.

3. The semiconductor device fabrication method according to claim 1, wherein said interlayer insulating film is a low dielectric constant film of a single layer having a relative dielectric constant of 2.8-3.5, or films stacked in layers and including at least said low dielectric constant film.

4. The semiconductor device fabrication method according to claim 3, wherein said low dielectric constant film is selected from the group consisting of SiOC, SiOF, hydrosiloxane and organosiloxane.

5. The semiconductor device fabrication method according to claim 1, wherein said interlayer insulating film comprises a low dielectric constant film, an etching stopper film beneath said low dielectric constant film for etching of said low dielectric constant film, and a protective film on said low dielectric constant film and having larger mechanical strength than said low dielectric constant film.

6. The semiconductor device fabrication method according to claim 5, wherein said etching stopper film is a SiC film.

7. The semiconductor device fabrication method according to claim 5, wherein said protective film is a $SiO_2$ film.

8. The semiconductor device fabrication method according to claim 5, wherein selectively etching said interlayer insulating film includes:
   etching said protective film and said low dielectric constant film to form a trench or a contact hole reaching said etching stopper film; and
   etching said etching stopper film at the bottom of said trench or contact hole to reach said metal wire.

9. The semiconductor device fabrication method according to claim 1, including ashing by introducing a carrier gas including hydrogen radicals generated by a plasma from said reducing gas.

* * * * *